(12) United States Patent
Lee et al.

(10) Patent No.: US 9,412,636 B2
(45) Date of Patent: Aug. 9, 2016

(54) METHODS FOR PROCESSING SUBSTRATES

(71) Applicant: Samsung Electronics Co., Ltd, Suwon-si, Gyeonggi-do (KR)

(72) Inventors: Chungsun Lee, Anyang-si (KR); Jung-Seok Ahn, Seoul (KR); Kwang-chul Choi, Suwon-si (KR); Un-Byoung Kang, Hwaseong-si (KR); Jung-Hwan Kim, Bucheon-si (KR); Joonsik Sohn, Yongin-si (KR); Jeon Il Lee, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/682,231

(22) Filed: Apr. 9, 2015

(65) Prior Publication Data
US 2015/0214089 A1 Jul. 30, 2015

Related U.S. Application Data

(63) Continuation of application No. 14/147,718, filed on Jan. 6, 2014, now Pat. No. 9,023,716.

(30) Foreign Application Priority Data

Jan. 25, 2013 (KR) ........................ 10-2013-0008692

(51) Int. Cl.
*H01L 21/58* (2006.01)
*H01L 21/683* (2006.01)
(Continued)

(52) U.S. Cl.
CPC ........ *H01L 21/6835* (2013.01); *B32B 37/1284* (2013.01); *B32B 37/18* (2013.01); *B32B 37/24* (2013.01); *B32B 37/26* (2013.01); *B32B 38/04* (2013.01); *B32B 38/10* (2013.01); *B32B 38/162* (2013.01); *H01L 21/02057* (2013.01); *H01L 21/02126* (2013.01); *H01L 21/304* (2013.01); *H01L 21/76898* (2013.01); *H01L 24/03* (2013.01); *H01L 24/14* (2013.01); *B32B 2037/268* (2013.01); *B32B 2315/08* (2013.01); *B32B 2457/14* (2013.01);
(Continued)

(58) Field of Classification Search
CPC ................ H01L 21/6836; H01L 2221/68318; H01L 2221/68363
USPC .......................................... 438/458, 464, 977
See application file for complete search history.

(56) References Cited

U.S. PATENT DOCUMENTS 6,506,664 B1   1/2003   Beyne et al.
6,649,017 B1   11/2003  Kurokawa
(Continued)

FOREIGN PATENT DOCUMENTS

JP   06-097017    4/1994
JP   2001-267592  9/2001
JP   2012-023244  2/2012

*Primary Examiner* — George Fourson, III
(74) *Attorney, Agent, or Firm* — Muir Patent Law, PLLC

(57) ABSTRACT

A method for processing substrates includes providing a bonding layer between a substrate and a carrier to bond the substrate to the carrier, processing the substrate while the substrate is supported by the carrier, and removing the bonding layer to separate the substrate from the carrier. The bonding layer may include a thermosetting release layer and thermosetting glue layers, wherein at least one of the thermosetting glue layers is provided on each side of the thermosetting release layer.

20 Claims, 17 Drawing Sheets

(51) Int. Cl.
*H01L 21/304* (2006.01)
*B32B 37/12* (2006.01)
*B32B 37/18* (2006.01)
*B32B 37/24* (2006.01)
*B32B 37/26* (2006.01)
*B32B 38/04* (2006.01)
*B32B 38/10* (2006.01)
*B32B 38/16* (2006.01)
*H01L 21/02* (2006.01)
*H01L 21/768* (2006.01)
*H01L 23/00* (2006.01)

(52) U.S. Cl.
CPC .... *H01L 21/6836* (2013.01); *H01L 2221/6834* (2013.01); *H01L 2221/68318* (2013.01); *H01L 2221/68327* (2013.01); *H01L 2221/68363* (2013.01); *H01L 2221/68372* (2013.01); *H01L 2221/68381* (2013.01); *H01L 2224/0401* (2013.01); *H01L 2224/05025* (2013.01); *H01L 2224/13023* (2013.01); *H01L 2924/12042* (2013.01); *H01L 2924/181* (2013.01); *Y10S 438/977* (2013.01)

(56) References Cited

U.S. PATENT DOCUMENTS

| | | |
|---|---|---|
| 6,666,752 B1 | 12/2003 | Yamamoto et al. |
| 7,384,811 B2 | 6/2008 | Miyamoto et al. |
| 7,736,948 B2 | 6/2010 | Dekker et al. |
| 8,408,833 B2 | 4/2013 | Bartschi et al. |
| 2001/0026001 A1 | 10/2001 | Yagi |
| 2012/0118388 A1 | 5/2012 | Keyes |
| 2012/0118582 A1 | 5/2012 | Soni et al. |
| 2012/0118659 A1 | 5/2012 | Shinde et al. |
| 2012/0118696 A1 | 5/2012 | Fabricius et al. |
| 2012/0118942 A1 | 5/2012 | Egli et al. |
| 2012/0119184 A1 | 5/2012 | Hsu et al. |
| 2012/0119342 A1 | 5/2012 | Chang Chien et al. |
| 2012/0119455 A1 | 5/2012 | Sun |
| 2012/0120585 A1 | 5/2012 | Yu et al. |
| 2012/0120631 A1 | 5/2012 | Zhang |
| 2012/0121317 A1 | 5/2012 | Warmus |
| 2012/0122007 A1 | 5/2012 | Kuehn et al. |
| 2012/0122390 A1 | 5/2012 | Becker |
| 2012/0122650 A1 | 5/2012 | Bartsch et al. |
| 2012/0122679 A1 | 5/2012 | Zhang et al. |
| 2012/0122680 A1 | 5/2012 | Holyoke, Jr. et al. |
| 2012/0123192 A1 | 5/2012 | Somsundaram et al. |
| 2012/0123350 A1 | 5/2012 | Giambattista et al. |
| 2012/0123365 A1 | 5/2012 | Pan et al. |
| 2014/0087180 A1* | 3/2014 | Maruyama ......... H01L 21/6836 428/336 |
| 2014/0213039 A1* | 7/2014 | Lee .................. H01L 21/6835 438/459 |

\* cited by examiner

METHODS FOR PROCESSING SUBSTRATES

CROSS-REFERENCE TO RELATED APPLICATIONS

This application is a Continuation of prior application Ser. No. 14/147,718, filed on Jan. 6, 2014 in the United States Patent and Trademark Office, which claims the benefit of priority under 35 U.S.C. §119 to Korean Patent Application 10-2013-0008692, filed on Jan. 25, 2013, the content of which is incorporated herein in its entirety by reference.

BACKGROUND

1. Field

An embodiment of the present inventive concept relates to methods of processing substrates and, more particularly, to methods of thinning wafers.

2. Description of the Related Art

In manufacturing semiconductor process, a wafer is bonded to a carrier with glue and release layers therebetween in order to thin the wafer by a back lap process. An ultraviolet (UV) curable adhesive is generally used as the glue layer. UV radiation is applied to the glue layer in order to use the UV curable adhesive, but the wafer can be damaged from the UV radiation. If a thermoplastic adhesive is adopted as the glue layer, a high temperature process cannot be applied due to poor thermal stability. Therefore, there is a need for a method of stably bonding a wafer to a carrier without damage to the wafer even when using a high temperature process.

SUMMARY

The present inventive concept provides a method for processing a substrate in which a carrier can be bonded to a wafer with thermal stability.

The present inventive concept also provides a method for processing a wafer in which a carrier can be easily separated from the wafer.

Additional features and utilities of the present general inventive concept will be set forth in part in the description which follows and, in part, will be obvious from the description, or may be learned by practice of the general inventive concept.

An embodiment of the present inventive concept is directed to a method for processing a substrate comprising providing a bonding layer between a substrate and a carrier to bond the substrate to the carrier, processing the substrate while the substrate is supported by the carrier, and removing the bonding layer to separate the substrate from the carrier, wherein the bonding layer may include a thermosetting release layer and thermosetting glue layers, and wherein at least one of the thermosetting glue layers is provided on each side of the thermosetting release layer.

In an example embodiment, a bonding force between the thermosetting release layer and one of the thermosetting glue layers may be less than a bonding force between one of the thermosetting glue layers and one of the substrate and the carrier.

In an embodiment, the thermosetting glue layers may comprise a first glue layer provided between the thermosetting release layer and the substrate and a second glue layer provided between the thermosetting release layer and the carrier.

In an embodiment, providing the bonding layer may comprise providing a first thermosetting material on the substrate to form the first glue layer, providing a second thermosetting material on the first glue layer to form the release layer, and providing a third thermosetting material on at least one of the release layer and the carrier to form the second glue layer.

In an embodiment, providing the first thermosetting material on the substrate to form the first glue layer may comprise coating at least one of siloxane and a thermosetting material that includes the siloxane on the substrate.

In an embodiment, providing the second thermosetting material on the first glue layer to form the release layer may comprise coating a precursor that includes at least one of polydimethylsiloxane (PDMS) and hexamethyldisiloxane (HMDSO) on the first glue layer and performing a chemical vapor deposition process using the hexamethyldisiloxane (HMDSO) as a reaction gas.

In an embodiment, providing the third thermosetting material on at least one of the release layer and the carrier to form the second glue layer may comprise coating at least one of siloxane and a thermosetting material that includes the siloxane on at least one of the release layer and the carrier.

In an embodiment, providing the bonding layer may further comprise strengthening the first and second glue layers and the release layer.

In an embodiment, removing the bonding layer to separate the substrate from the carrier may comprise detaching the carrier and the second glue layer from the release layer and cleaning the substrate.

In an embodiment, cleaning the substrate may comprise providing a cleaning solution on the substrate to remove the first glue layer while the release layer remains on the substrate, wherein the cleaning solution may include acetate mixed with at least one of diazabicycloundecene (DBU) and tetra-n-butylammonium fluoride (TBAF).

In an embodiment, providing the bonding layer may comprise providing a first thermosetting material on the substrate to form the first glue layer, providing a second thermosetting material on the first glue layer to form the release layer, patterning the release layer to expose an edge of the first glue layer located at an edge of the substrate, and providing a third thermosetting material on at least one of the first glue layer and the carrier to form the second glue layer, wherein the second glue layer may contact the the edge of the first glue layer.

Another embodiment of the present inventive concept is directed to a method for processing a substrate comprising sequentially forming a first thermosetting glue layer and a thermosetting release layer on a substrate, providing a second thermosetting glue layer to the release layer between the substrate and a carrier to bond the substrate to the carrier, thinning the substrate while the substrate is supported by the carrier to produce a thinned substrate, separating the carrier and the second glue layer from the release layer, and cleaning the thinned substrate to remove the release layer and the first glue layer from the thinned substrate.

In an embodiment, thinning the substrate may comprise forming at least one recess on a first surface of the substrate, wherein the first surface may be opposite to a second surface on which the first glue layer is formed, and wherein at least one through electrode included in the substrate may be exposed through the recessed second surface of the thinned substrate.

In an embodiment, the release layer may comprise at least one of polydimethylsiloxane (PDMS) and hexamethyldisiloxane (HMDSO), and wherein the first and second glue layers may comprise siloxane.

In an embodiment, the substrate may comprise a semiconductor wafer including a plurality of bumps and a plurality of through electrodes electrically connected to the plurality of bumps, and wherein the carrier may comprise one of a glass substrate and a material identical to that of the substrate.

In an embodiment, an integrated circuit chip may be formed using the method.

Another embodiment of the present inventive concept is directed to a method for processing a substrate comprising forming a first thermosetting glue layer on the substrate and a first thermosetting release layer on the first thermosetting glue layer, forming a second thermosetting glue layer on a carrier, bonding the substrate to the carrier, processing the substrate while the substrate is supported by the carrier, and removing the carrier from the substrate.

In an embodiment, the forming the second thermosetting glue layer on the carrier may comprise forming a first portion of the second thermosetting glue layer on the carrier and forming a second portion of the second thermosetting glue layer on the first thermosetting release layer.

In an embodiment, the method may further comprise forming a second thermosetting release layer on the first portion of the second thermosetting glue layer on the carrier.

In an embodiment, the removing the substrate from the carrier may comprise causing a crack to propagate through the second thermosetting release layer.

BRIEF DESCRIPTION OF THE DRAWINGS

These and/or other features and utilities of of the present general inventive concept will become apparent and more readily appreciated from the following description of the embodiments, taken in conjunction with the accompanying drawings of which:

FIG. 1D is a cross sectional view illustrating a modified example of FIG. 1C;

FIG. 1E is a cross sectional view illustrating another modified example of FIG. 1C;

FIG. 1F is a cross sectional view illustrating an example of a portion of FIG. 1C;

FIG. 1G is a cross sectional view illustrating a modified example of FIG. 1F;

FIG. 2F is an enlarged view illustrating an example of a portion of FIG. 2E;

FIG. 3C is a cross sectional view illustrating an example of a portion of FIG. 3B;

FIG. 3F is a cross sectional view illustrating a modified example of FIG. 3E;

DETAILED DESCRIPTION OF THE EMBODIMENTS

Figure 1A:
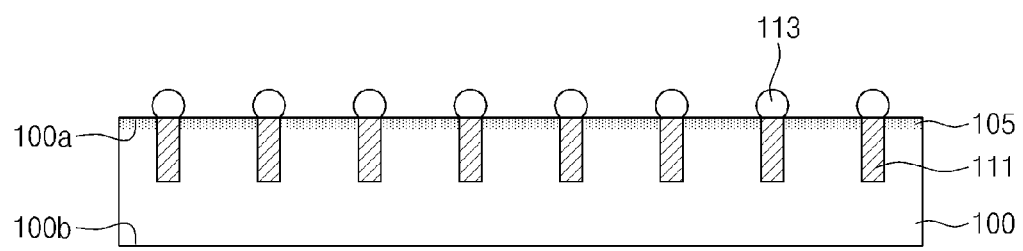
FIGS. 1A to 1K are cross sectional views illustrating an example of a method for processing a substrate, according to an embodiment of the present inventive concept.

Reference will now be made in detail to the embodiments of the present general inventive concept, examples of which are illustrated in the accompanying drawings. Example embodiments, may, however, be embodied in many different forms and should not be construed as being limited to the embodiments set forth herein; rather, these example embodiments are provided so that this disclosure will be thorough and complete, and will fully convey the scope of example embodiments of the inventive concept to those of ordinary skill in the art. In the drawings, the thicknesses of layers and regions are exaggerated for clarity. Like reference numerals in the drawings refer to the like elements throughout. The embodiments are described below in order to explain the present general inventive concept while referring to the figures.

Figure 1B:
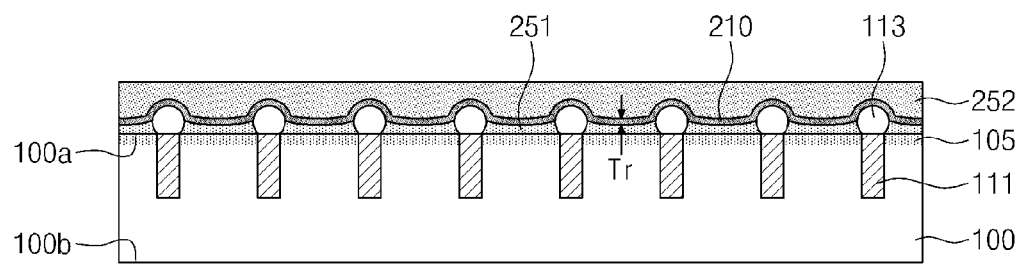
Figure 1C:
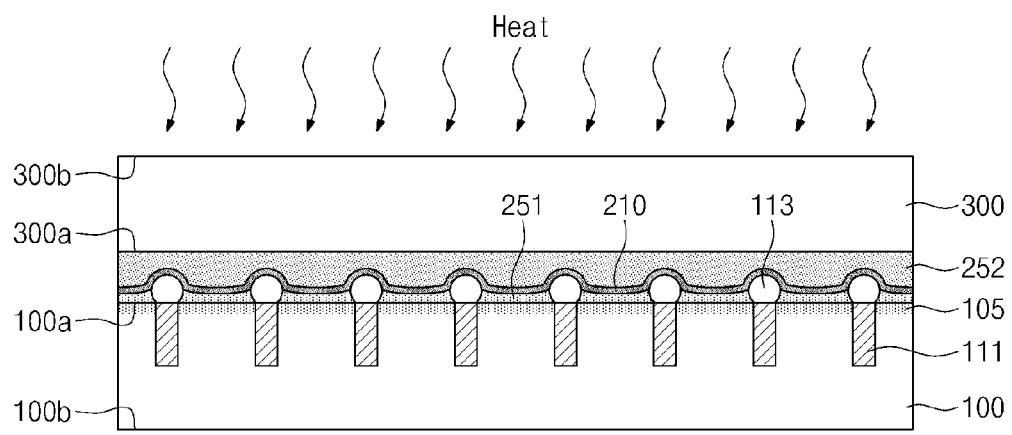
Figure 1D:
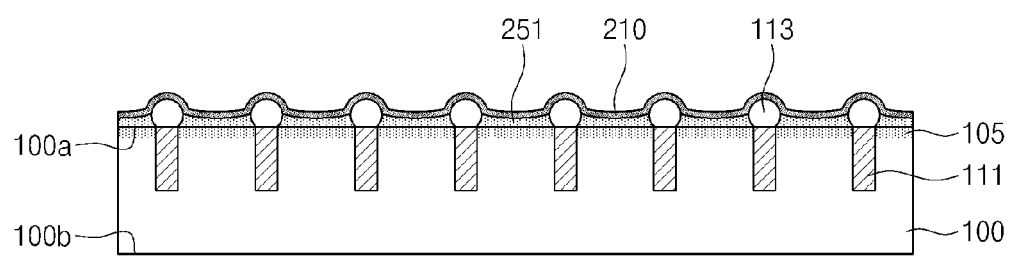
Figure 1D:
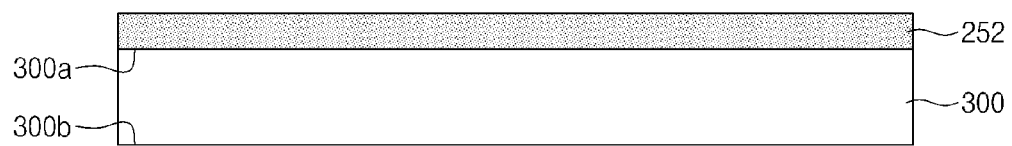
Figure 1E:
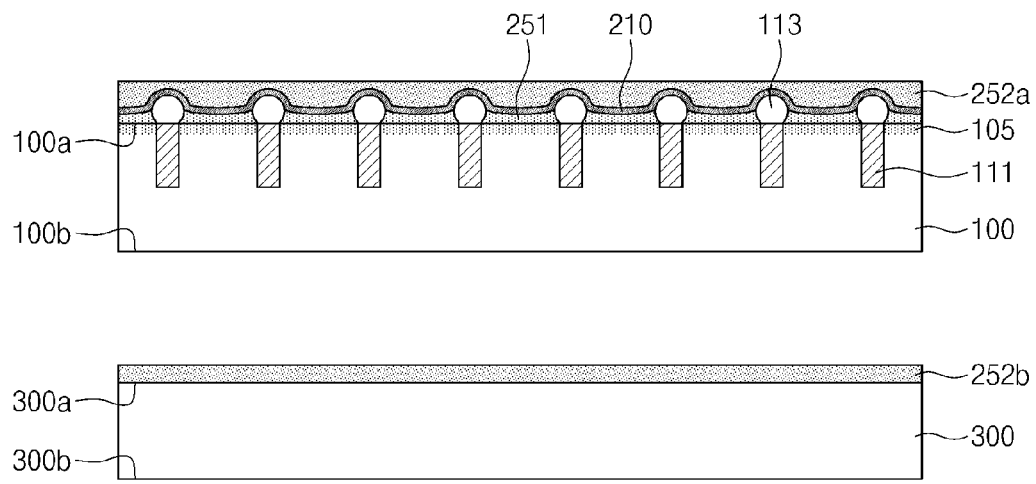
Figure 1F:
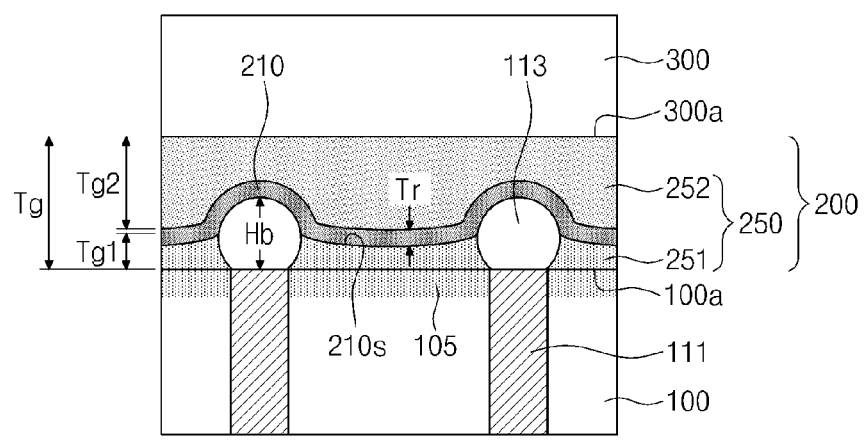
Figure 1G:
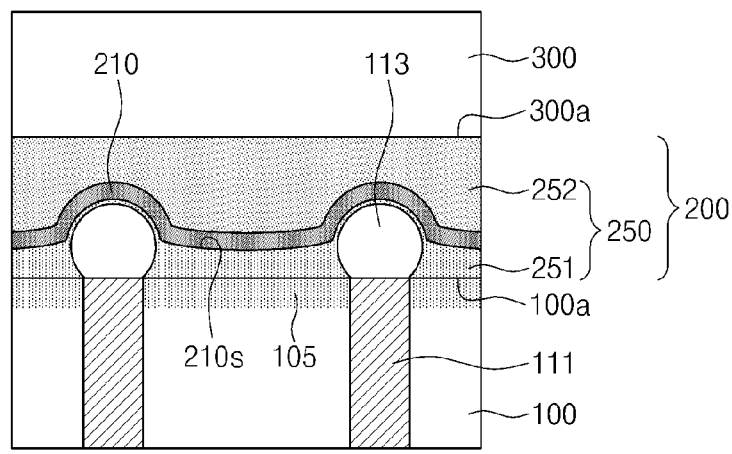

FIGS. 1A to 1K are cross sectional views illustrating an example of a method for processing a substrate, according to an embodiment of the present inventive concept. FIG. 1D is a cross sectional view illustrating a modified example of FIG. 1C. FIG. 1E is a cross sectional view illustrating another modified example of FIG. 1C. FIG. 1F is a cross sectional view illustrating an example of a portion of FIG. 1C. FIG. 1G is a cross sectional view illustrating a modified example of FIG. 1F.

Referring to FIG. 1A, a substrate 100 may be provided. The substrate 100 may be a wafer level semiconductor substrate such as silicon wafer. The substrate 100 may be referred to as a wafer 100 hereinafter. The wafer 100 may comprise an upper surface 100$a$, at which an integrated circuit 105 is formed, and a lower surface 100$b$ opposite the upper surface 100$a$. The integrated circuit 105 may comprise a memory circuit, a logic circuit, or a combination thereof. The wafer 100 may comprise a plurality of through electrodes 111, which extend in a thickness direction and have lengths that partially penetrate the wafer 100. A plurality of bumps 113 may be provided on the upper surface 100$a$ of the wafer 100. The bumps 113 may be electrically connected to the plurality of through electrodes 111.

Referring to FIG. 1B, a first glue layer 251, a release layer 210, and a second glue layer 252 may be sequentially formed on the upper surface 100$a$ of the wafer 100. Each of the release layer 210 and the first and second glue layers 251 and 252 may comprise, for example, a thermosetting material. According to an embodiment, the first glue layer 251 may be formed by coating a thermosetting resin, such as, for example, silicone (identified by a chemical structure described below), a material comprising silicone, or a siloxane-based material, on the upper surface 100$a$ of the wafer 100. Alternatively, the first glue layer 251 may be formed, for example, from tripropylenemelamine (TMAT) or any material that includes TMAT.

Depending on the adjusted viscosity of the first glue layer 251, the first glue layer 251 may fill spaces between the adjacent bumps 113 and may not cover the bumps 113, or the first glue layer 251 may be formed to cover the bumps 113.

The release layer 210 may be formed by a chemical vapor deposition process using a material that includes, for example, silicone (e.g., polydimethylsiloxane (PDMS), hexamethyldisiloxane (HMDSO), or a combination thereof) as a precursor, and HDMSO as a source.

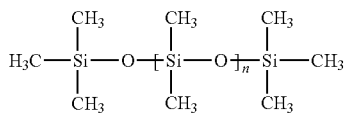

For example, the release layer 210 may be formed by spin coating a precursor that includes, for example, PDMS as a main material and a liquid HMDSO as a solvent with a ratio from about 1:50 to about 1:200 (i.e., PDMS:HMDSO=1:50 to 1:200) on the first glue layer 251, and then performing a plasma enhanced chemical vapor deposition (PECVD) process using, for example, a gaseous HMDSO as a source.

The spin coating may be performed for several tens of seconds (e.g., about 20 seconds). The PECVD may be performed under conditions that include a radio frequency (RF) power of about tens of watts (e.g., about 40 W), a chamber pressure of about tens of mTorr (e.g., about 40 mTorr), a plasma time of about several tens of seconds to minutes (e.g., about 65 seconds), and an HMDSO gas flow rate of about tens of sccm (e.g., about 15 sccm). The release layer 210 may cover the bumps 113 and may cause the first glue layer 251 to have a curved shape that extends along the bumps 113.

As described later in FIG. 1J, a thickness Tr (shown in FIG. 1F) of the release layer 210 may be inversely proportional to a force required to detach the second glue layer 252. In other words, the greater the thickness Tr of the release layer 210, the lower the force to separate the second glue layer 252. The thickness Tr of the release layer 210 may depend on the conditions of the spin coating and the PECVD processes.

In the spin coating process, if the ratio of PDMS to HMDSO increases (i.e., the HMDSO content increases) and the coating speed decreases (i.e., spin speed decreases), the thickness Tr of the release layer 210 may increase.

In the PECVD process, if the RF power is greater, the chamber pressure is lower, and the plasma time (i.e., process time) is longer, the deposition rate may increase so that the thickness Tr of the release layer 210 may increase.

The release layer 210 may become stronger or harder if the plasma intensity increases and the plasma time becomes longer. Alternatively, the release layer 210 may become weaker or softer if the plasma intensity decreases and the plasma time becomes shorter. If the release layer 210 is too strong or hard, the release layer 210 may be delaminated and/or cracks may occur. If the release layer 210 is too weak or soft, the release layer 210 may remain in a liquid state and be easily wiped off. Under the plasma deposition conditions described above, the release layer 210 may have a stable structure identical or analogous to a fully cross-linked structure.

The second glue layer 252 may be formed by coating a material identical or analogous to that of the first glue layer 251. For example, a material that includes silicone or a siloxane-based material may be coated on the release layer 210 to form the second glue layer 252. The second glue layer 252 may have a curved shape that extends along the bumps 113. Alternatively, the second glue layer 252 may be formed, for example, from tripropylenemelamine (TMAT) or any material that includes TMAT.

Referring to FIG. 1C, a carrier 300 may be bonded to the wafer 100. The carrier 300 may be, for example, a silicon substrate having a size and material identical or analogous to those of the wafer 100. Alternatively, the carrier 300 may be, for example, a transparent substrate such as a glass substrate. The carrier 300 may comprise an upper surface 300a and a lower surface 300b opposite the upper surface 300a. The carrier 300 may be bonded to the wafer 100 so that the upper surface 300a may face the upper surface 100a of the wafer 100. Optionally, the first and second glue layers 251 and 252 and the release layer 210 may be strengthened by applying heat to improve the heat-resistance and/or adhesion properties.

The wafer 100 may be first baked in a deposition chamber at a low temperature that is insufficient to strengthen the glue layers 251 and 252 and the release layer 210, and thereafter the wafer 100 may be second baked in a bake chamber at a high temperature sufficient to strengthen the glue layers 251 and 252 and the release layer 210. The first and second baking processes may be performed for several tens of minutes. For example, the first baking process may be performed at a temperature from about 100° C. to about 180° C. from about 5 minutes to about 15 minutes, and the second baking process may be performed at a temperature from about 150° C. to about 250° C. from about 5 minutes to about 15 minutes.

Alternatively, as illustrated in FIG. 1D, the second glue layer 252 may be formed on the carrier 300. For example, the first glue layer 251 and the release layer 210 may be sequentially formed on the upper surface 100a of the wafer 100, and the second glue layer 252 may be formed on the upper surface 300a of the carrier 300.

As another embodiment, as illustrated in FIG. 1E, a first sub-glue layer 252a and a second sub-glue layer 252b may be formed on the wafer 100 and the carrier 300, respectively. For example, the first glue layer 251 and the release layer 210 and the first sub-glue layer 252a may be sequentially formed on the upper surface 100a of the wafer 100, and the second sub-glue layer 252b may be formed on the upper surface 300a of the carrier 300. When the wafer 100 and the carrier 300 are bonded together, the first sub-glue layer 252a and the second sub-glue layer 252b may be bonded together to form the second glue layer 252.

Referring to FIG. 1F, the first glue layer 251 and the second glue layer 252 may comprise a glue layer 250, and the release layer 210 may be embedded within the glue layer 250. The glue layer 250 and the release layer 210 may comprise a bonding layer 200, which may attach the wafer 100 to the carrier 300.

The first glue layer 251 may fill spaces between adjacent bumps 113. The first glue layer 251 may have a thickness Tg1 that is less than a height Hb of the bump 113. The first glue layer 251 may have an inclined surface 210s having an upward slope from the upper surface 100a of the wafer 100 towards the bump 113. For example, the first glue layer 251 may have the thickness Tg1 (referred to as a first thickness hereinafter) from about 30% to about 50% of the height Hb of the bump 113. Depending on the viscosity of the first glue layer 251, the first glue layer 251 may have a shape that wraps around the bumps 113, as illustrated in FIG. 1G, or the first glue layer 251 may cover the bumps 113.

The release layer 210 may have a shape that curves along the profile of the bumps 113 and have a thickness Tr that is less than the that of the first glue layer 251. The second glue layer 252 may have a shape that extends along the upper surface 100a of the wafer 100 and curves along the profile of the bumps 113.

A thickness Tg2 (referred to as a second thickness hereinafter) of the second glue layer 252 may be the same as or greater than the first thickness Tg1. The sum of the first and second thicknesses Tg1 and Tg2 may be substantially the same as a distance between the wafer 100 and the carrier 300, i.e., the thickness Tg of the glue layer 250.

The thickness Tr of the release layer 210 may be less than the thickness Tg of the glue layer 250. For example, the thickness Tg of the glue layer 250 may be about 70 µm to about 120 µm, and the thickness Tr of the release layer 210 may be from about 200 nm to about 220 nm.

A surface topology or roughness may be found on the upper surface 100a of the wafer 100 because the wafer 100 may have the bumps 113 formed thereon. The upper surface 300a of the carrier 300 may be smoother or flatter than the upper surface 100a of the wafer 100. Due to the surface topology or roughness, a bonding force (or bonding strength) between the wafer 100 and the glue layer 250 may be stronger than a bonding force (or bonding strength) between the carrier 300 and the glue layer 250. The spherically shaped bumps 113 may make the bonding force between the wafer 100 and the glue layer 250 stronger.

A bonding force between the release layer 210 and the glue layer 250 may be weaker than the bonding forces between the wafer 100 and the glue layer 250 and between the carrier 300 and the glue layer 250. As described above, the release layer 210 may provide a relatively weaker bonding strength at an inside of the bonding layer 200 so that the carrier 300 may be more easily separated from the wafer 100.

Figure 1H:
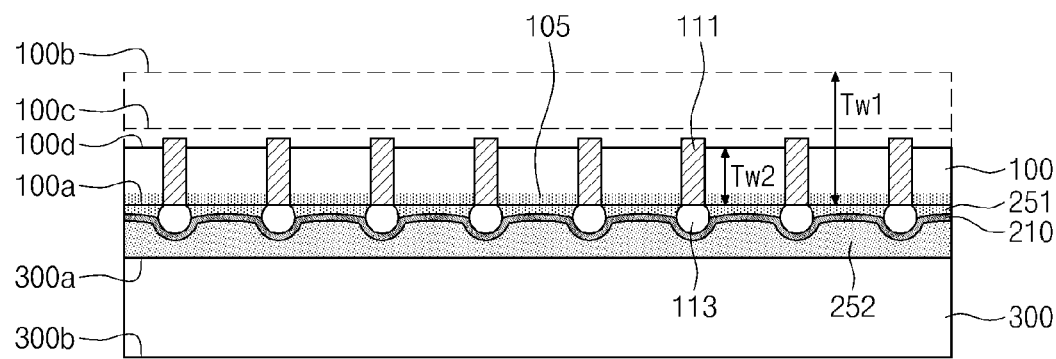

Referring to FIG. 1H, the wafer 100 may be back-lapped. According to some embodiments, the wafer 100 may be supported by the carrier 300 and may be thinned by performing, for example, at least one of one of a chemical and/or mechanical polishing, a wet etching, a dry etching, a spin etching, a grinding, and so forth one time or several times until the through electrodes 111 are exposed.

For example, a chemical and/or mechanical polishing process may be performed on the lower surface 100b of the wafer 100 to remove wafer material until at least a second lower surface 100c is reached, a level at which the through electrodes 111 are not exposed. A dry etching process, for example, may then be performed on the second lower surface 100c to remove wafer material until at least a third surface 100d is reached, a level at which the through electrodes 111 are exposed. Alternatively, the through electrodes 111 may be exposed by forming recesses in the lower surface 100b of the wafer 100 using a single process such as, for example, chemical and/or mechanical polishing to remove wafer material until the third lower surface 100d is reached. In some embodiments, the upper surface 100a of the wafer 100 may be referred to as an 'active surface 100a', and the third surface 100d of the wafer 100 may be referred to as a 'non-active surface 100d'.

The wafer 100 may be thinned by the back-lap process from a first thickness Tw1 to a second thickness Tw2. For example, the first thickness Tw1 may be about several hundreds of micrometers and the second thickness Tw2 may be about several tens of nanometers. The thinned wafer 100 may be difficult to handle, but the carrier 300 may make handling the wafer 100 easier.

Figure 1I:
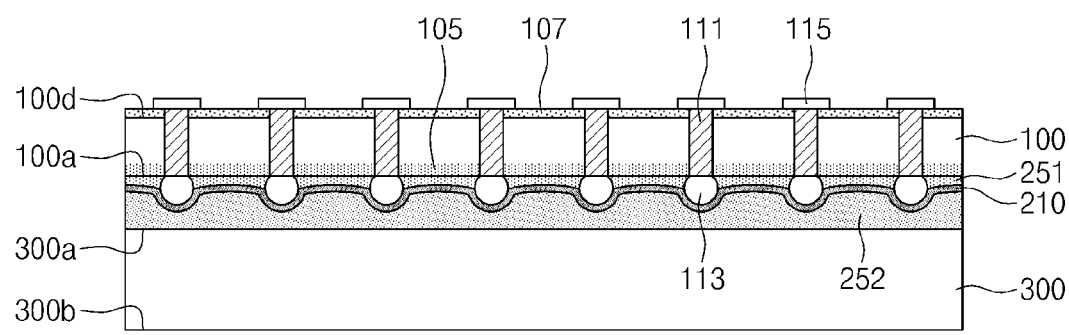

Referring to FIG. 1I, a lower insulation layer 107 may be formed to cover the non-active surface 100d of the wafer 100, and a plurality of pads 115 may be formed on the lower insulation layer 107 to be electrically connected to the through electrodes 111. For example, an insulator may be first deposited on the non-active surface 100d to cover the through electrodes 111 and then planarized to expose the through electrodes 111 and form the lower insulation layer 107. Then, a conductor may be deposited on the lower insulation layer 107 and patterned to form the pads 115 that are electrically connected to the through electrodes 111.

According to an embodiment, a high temperature may be necessary to perform the wafer thinning process of FIG. 1H and/or the post fabrication process of FIG. 1I. Compared with the case in which at least one of the glue and release layers includes a thermoplastic material, the thermosetting release layer 210 and the first and second thermosetting glue layers 251 and 252 may be more stable during a high temperature process. Therefore, it may be possible to maintain a stable bonding between the wafer 100 and the carrier 300 during a high temperature process.

Figure 1J:
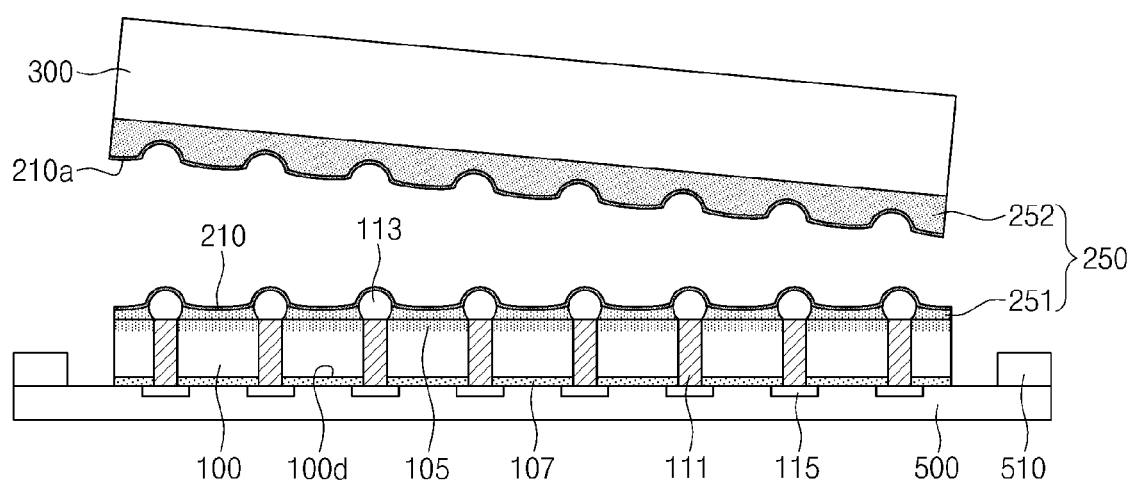

Referring to FIG. 1J, the carrier 300 may be separated from the wafer 100. For example, the carrier 300 may be detached by a clamping tool capable of grasping an end of the carrier 300. Because the bonding force between the glue layer 250 and the release layer 210 is stronger than the bonding forces between the wafer 100 and the first glue layer 251 and between the carrier 300 and the second glue layer 252, the carrier 300 may be relatively easily separated from the wafer 100. After separation of the carrier 300, the release layer 210 and the second glue layer 252 may remain on the wafer 100. Alternatively, a portion 210a of the release layer 210 may be detached from the wafer 100 along with the carrier 300. Optionally, protection tape 500 may be attached to the non-active surface 100d of the wafer 100 and a holder 510 may be used to hold the wafer 100 stable when the carrier 300 is separated from the wafer 100.

According to an embodiment, as illustrated in FIG. 1F, because the first glue layer 251 wraps around a lower portion of the bumps 113, the bumps 113 may not suffer from interlocking when the carrier 300 is separated from the wafer 100. In other words, because the first glue layer 251 may reduce the surface topology or roughness of the upper surface 100a of the wafer 100, there may be no interlocking of the bumps 113 during the separation of the carrier 300. Consequently, regardless of the height Hb and/or the distribution density of the bumps 113, the bumps 113 may be free from breakage and/or separation from the wafer 100 that might otherwise occur if the bumps 113 interlocked.

Figure 1K:
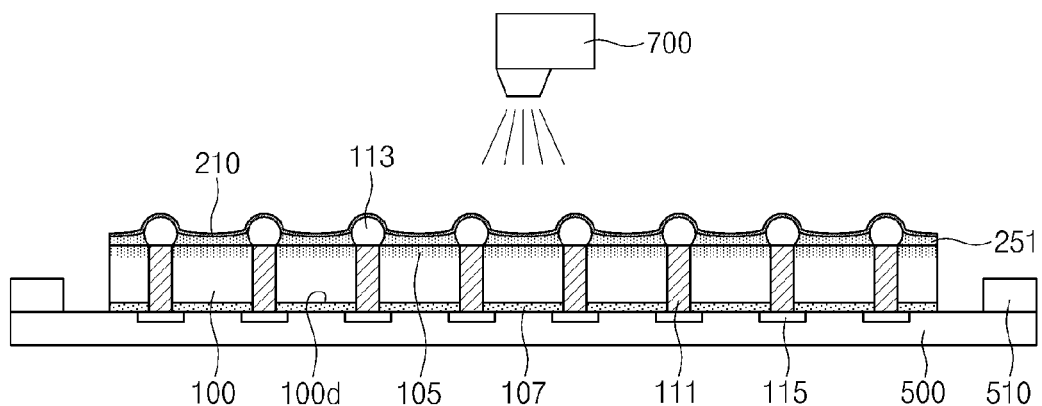

Referring to FIG. 1K, the wafer 100 may be cleaned. The wafer cleaning process may remove the release layer 210 and the first glue layer 251. For example, a cleaning solution may be sprayed onto the wafer 100 through a sprayer 700 to remove the release layer 210 and the first glue layer 251. The cleaning solution may comprise, for example, at least one of diazabicycloundecene (DBU) and tetra-n-butylammonium fluoride (TBAF) that is mixed with a solvent, such as acetate. The above mentioned processes may fabricate a thinned wafer 100 that includes the through electrodes 111. The thinned wafer 100 may be packaged through processes that will be described later.

Figure 1L:
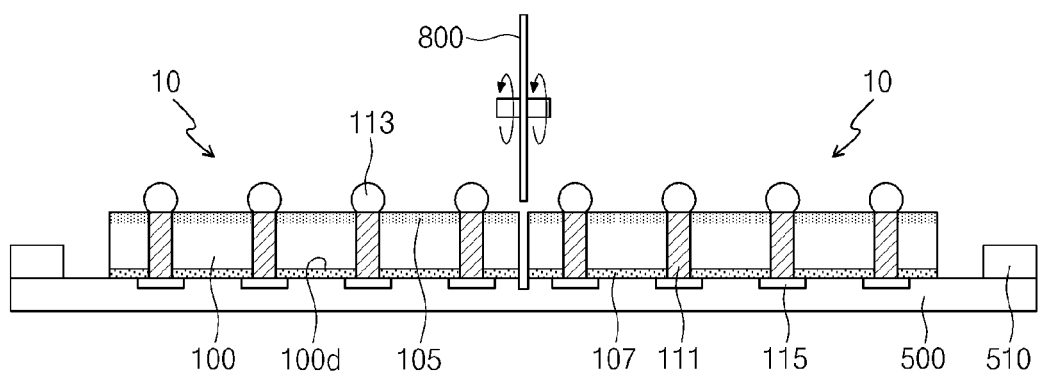
FIG. 1L is a cross sectional view illustrating an example of a method of fabricating a semiconductor chip using the method for processing a substrate, according to an embodiment of the present inventive concept.
Figure 1M:
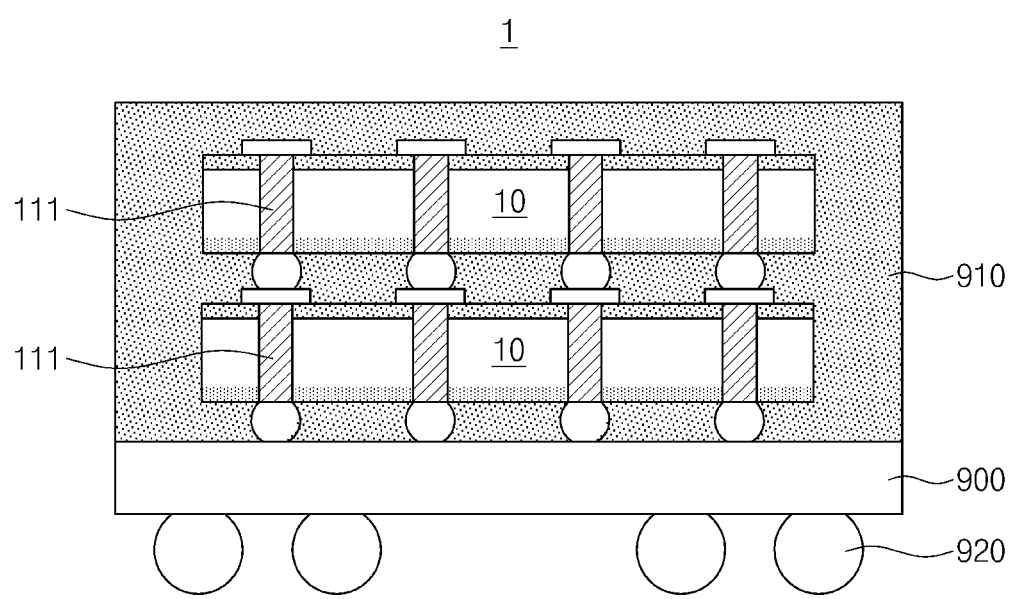
FIG. 1M is a cross sectional view illustrating an example of a method of fabricating a semiconductor package using the method for processing a substrate, according to an embodiment of the present inventive concept.

FIG. 1L is a cross sectional view illustrating an example of a method of fabricating a semiconductor chip using the method for processing a substrate, according to an embodiment of the present inventive concept. FIG. 1M is a cross sectional view illustrating an example of a method of fabricating a semiconductor package using the method for processing a substrate, according to an embodiment of the present inventive concept.

Referring to FIG. 1L, the wafer 100 may be divided into a plurality of semiconductor chips 10 by a wafer sawing process. The wafer sawing process may be performed to cut the wafer 100 along a scribe lane using a cutting wheel 800 so that the wafer 100 may be divided into the plurality of semiconductor chips 10. At least one of the semiconductor chips 10 may be packaged. Alternatively, the wafer sawing process may be performed using a laser.

Referring to FIG. 1M, at least one of the semiconductor chips 10 may be mounted on a printed circuit board 900 and the at least one semiconductor chip 10 may be molded to form a semiconductor package 1. For example, more than one semiconductor chips 10 may be mounted on an upper surface of the printed circuit board 900 and then a mold layer 910 may be formed using an insulator, such as, for example, epoxy molding compound (EMC). In the semiconductor package 1, the semiconductor chips 10 may be flip-chip bonded so that the through electrodes 111 may provide electrical paths between the printed circuit board 900 and the semiconductor chips 10 and/or between the semiconductor chips 10 on different layers. An external terminal 920, such as solder ball, may be provided on a lower surface of the printed circuit board 900.

Figure 2A:
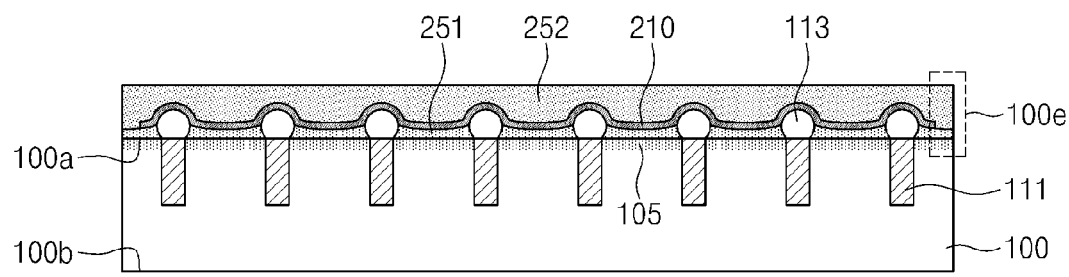
FIGS. 2A to 2F are cross sectional views illustrating an example of a method for processing a substrate according to an embodiment of the present inventive concept.
Figure 2B:
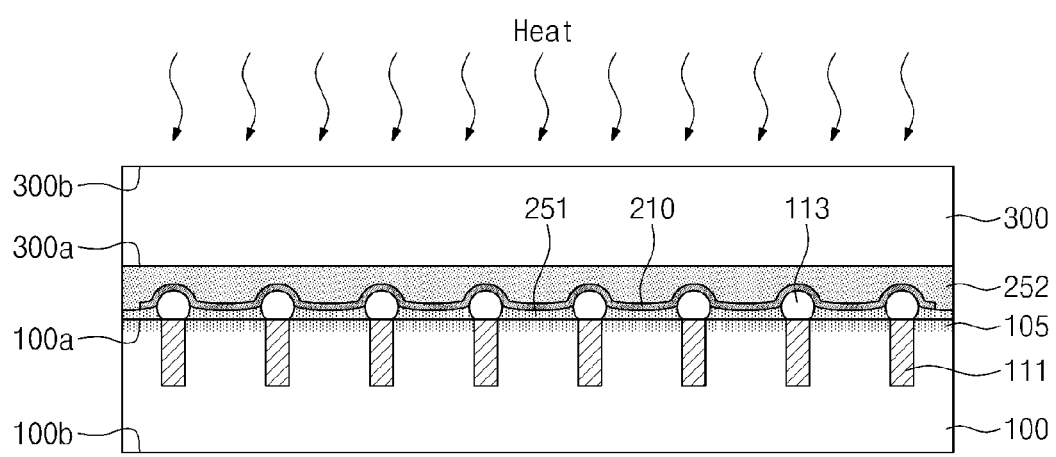
Figure 2C:
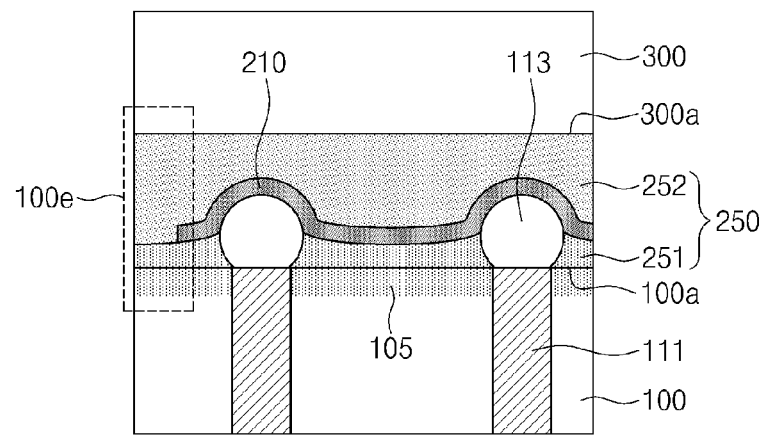
Figure 2D:
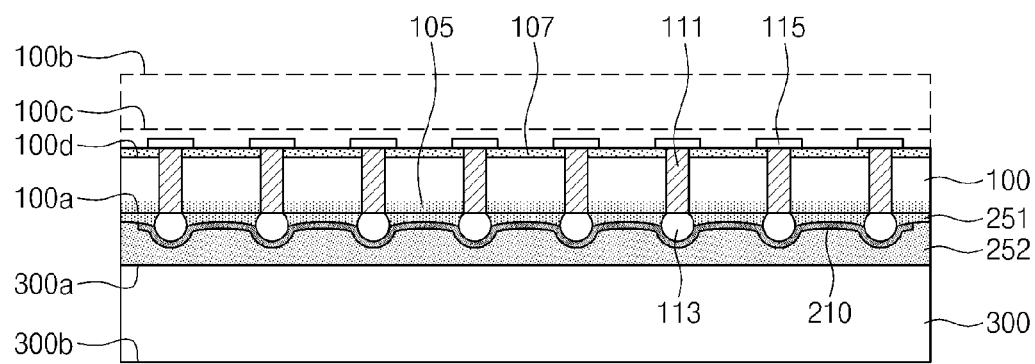
Figure 2E:
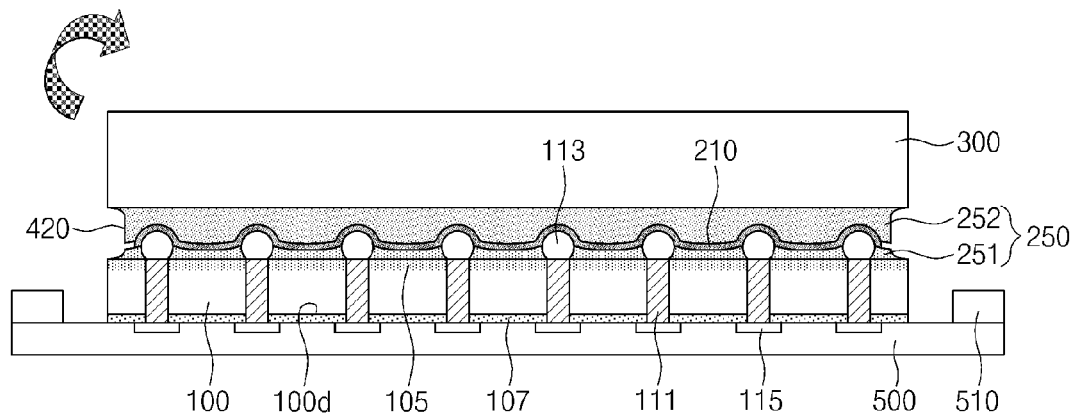
Figure 2F:
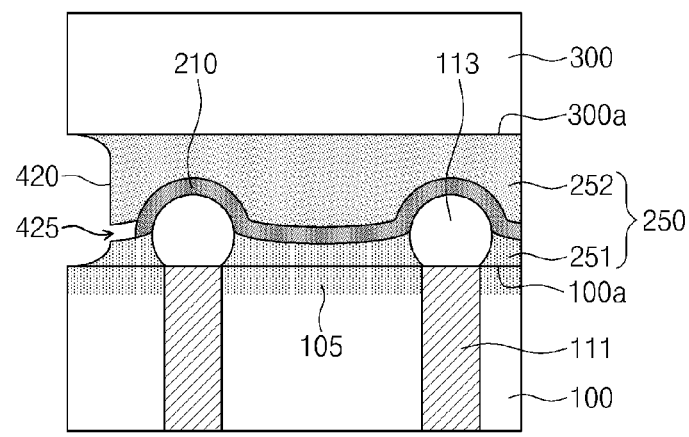

FIGS. 2A to 2F are cross sectional views illustrating an example of a method for processing a substrate, according to an embodiment of the present inventive concept. FIG. 2F is an enlarged view illustrating an example of a portion of FIG. 2E.

Referring to FIG. 2A, the first glue layer 251, the release layer 210, and the second glue layer 252 may be sequentially formed on the active surface 100a of the wafer 100. According to an embodiment, a thermosetting resin, for example, may be deposited on the first glue layer 251 by a plasma enhanced chemical vapor deposition process and then patterned to form the release layer 210. Due to the patterning step, the release layer 210 may not cover an edge 100e of the wafer 100. The second glue layer 252 may be bonded to the first glue layer 251 on the edge 100e of the wafer 100. Alternatively, the second glue layer 252 may be formed on the carrier 300 as illustrated in FIG. 1D. In another embodiment, the first sub-glue layer 252a may be formed on the wafer 100 and the second sub-glue layer 252b may be formed on the carrier 300 as illustrated in FIG. 1E.

Referring to FIGS. 2B and 2C, the wafer 100 and the carrier 300 may be bonded together so that the upper surface 100a of the wafer 100 may face the upper surface 300a of the carrier 300. Optionally, the first and second glue layers 251 and 252 and the release layer 210 may be strengthened by applying heat. According to an embodiment, the release layer 210 may be embedded within the glue layer 250, which includes the first glue layer 251 and the second glue layer 252, and the glue layer 250 may be in contact with both the wafer 100 and the carrier 300 at the edges 100e of the wafer 100. Therefore, the wafer 100 and the carrier 300 may be firmly bonded together at the edge 100e of the wafer 100.

Referring to FIG. 2D, the lower surface 100b of the wafer 100 may be polished, for example, by a chemical and/or mechanical polishing process to remove wafer material until the second lower surface 100c is reached, a level at which the through electrodes 111 are not exposed. The through electrodes 111 may then be exposed by forming recesses in the second lower surface 100c using, for example, a dry etching process until the non-active surface 100d is reached. The lower insulation layer 107 may be formed on the non-active surface 100d and the pads 115 may be formed on the lower insulation layer 107 to be electrically connected to the through electrodes 111.

Referring to FIGS. 2E and 2F, the carrier 300 and the wafer 100 may be separated from each other. The carrier 300 may be separated from the wafer 100 using protection tape 500 that adheres to the non-active surface 100d of the wafer 100. A side edge of the glue layer 250 may be removed to form a recess region 420 that exposes the release layer 210, and the carrier 300 may be detached from the wafer 100 using the portion of the release layer 210 that is exposed. The second glue layer 252 may be detached from the wafer 100 along with the carrier 300. The recess region 420 may be formed, for example, by a physical or chemical method.

For example, the glue layer 250 may be chemically removed by an etchant comprising at least one of diazabicycloundecene (DBU) and tetra-n-butylammonium fluoride (TBAF) that is mixed with a solvent, such as acetate. The side edge of the glue layer 250 may be, for example, chemically etched to form the recess region 420. If the etching rate of the release layer 210 is faster than that of the glue layer 250, a groove 425 may be formed in the release layer 210. The groove 425 may act as a crack so that the carrier 300 may be separated from the wafer 100 more easily. Alternatively, a laser or a blade may be used to remove the side edge of the glue layer 250 to form the recess region 420.

Thereafter, as illustrated in FIG. 1K, the release layer 210 and the first glue layer 251 may be removed by supplying a cleaning solution including, for example, at least one of diazabicycloundecene (DBU) and tetra-n-butylammonium fluoride (TBAF) that is mixed with a solvent, such as acetate. The above mentioned processes may fabricate the thinned wafer 100 that includes the through electrodes 111.

Figure 3A:
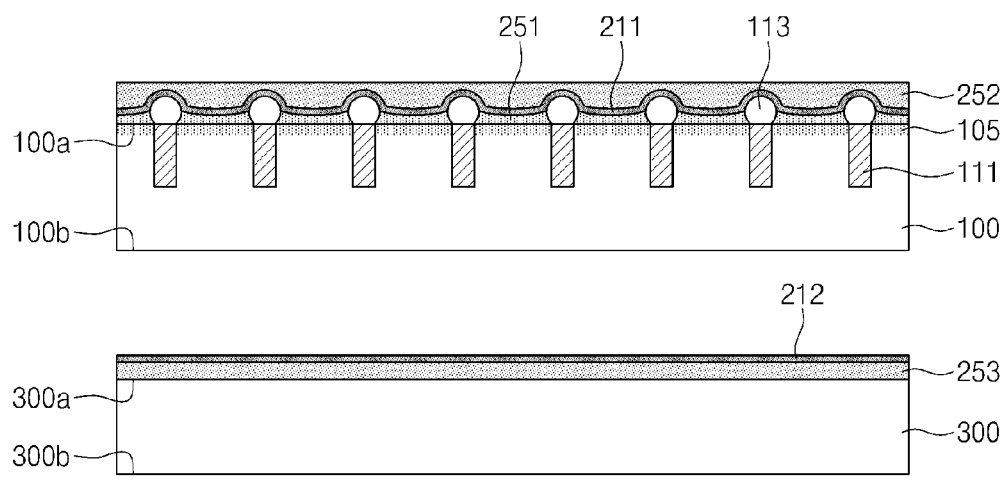
FIG. 3A to 3I are cross sectional views illustrating an example of a method for processing a substrate according to an embodiment of the present inventive concept.
Figure 3B:
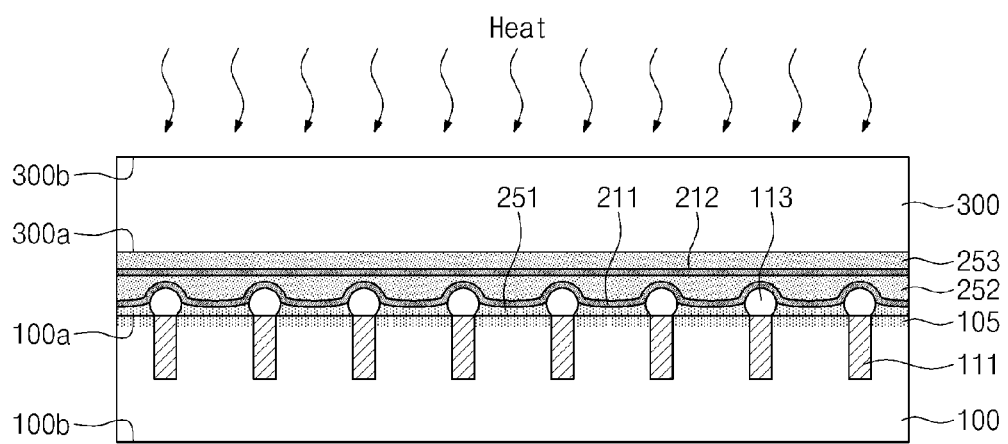
Figure 3C:
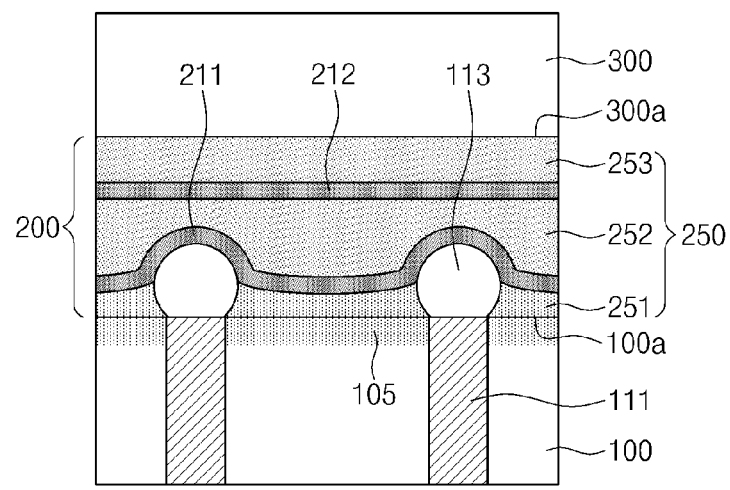
Figure 3D:
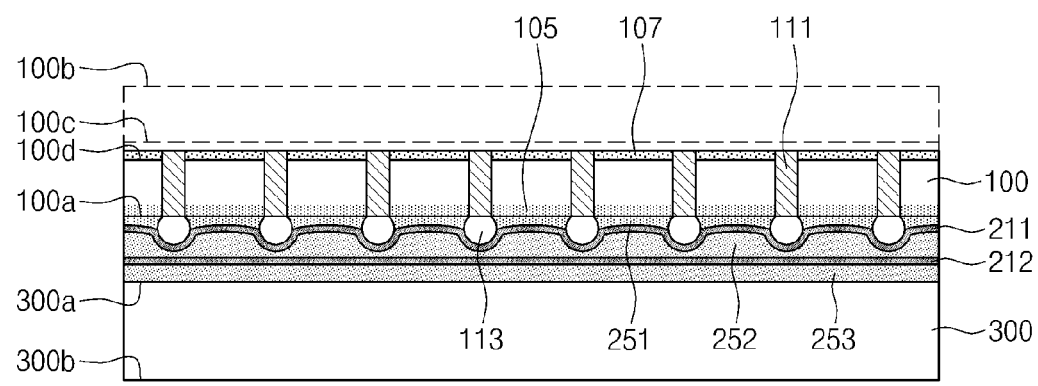
Figure 3E:
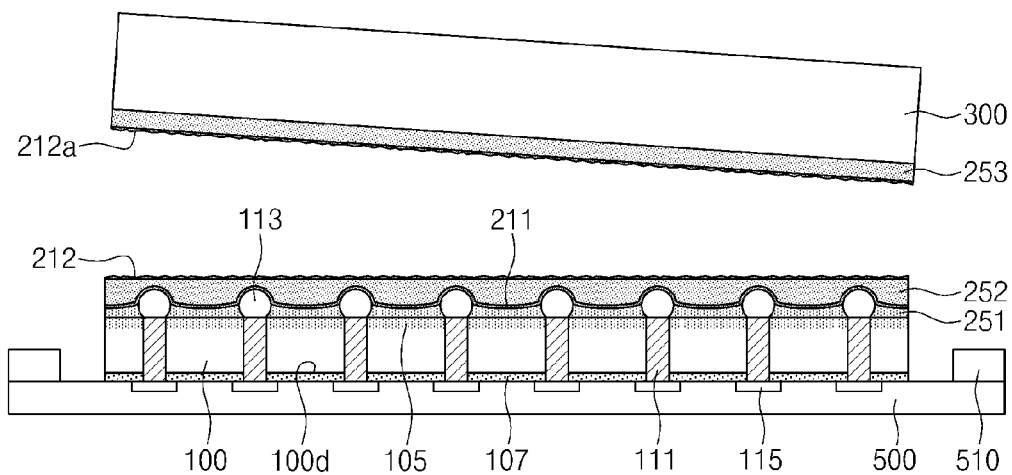
Figure 3F:
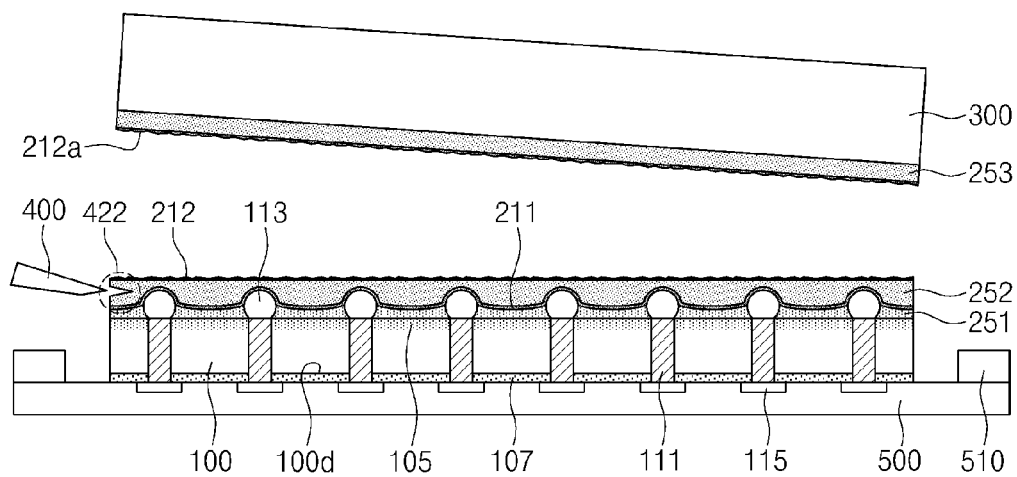

FIG. 3A to 3I are cross sectional views illustrating an example of a method for processing a substrate, according to an embodiment of the present inventive concept. FIG. 3C is a cross sectional view illustrating an example of a portion of FIG. 3B. FIG. 3F is a cross sectional view illustrating a modified example of FIG. 3E.

Referring to FIG. 3A, the first glue layer 251, a first release layer 211, and the second glue layer 252 may be sequentially formed on the upper surface 100a of the wafer 100. A third glue layer 253 and a second release layer 212 may be sequentially formed on the upper surface 300a of the carrier 300. According to an embodiment, thermosetting resins, including, for example, siloxane-based material, may be applied to form the first and second glue layers 251 and 252 on the wafer 100, and to form the third glue layer 253 on the carrier 300. By depositing and patterning thermosetting resins, the first release layer 211 may be formed on the first glue layer 251, and the second release layer 212 may be formed on the third glue layer 253. The first and second release layers 211 and 212 may be formed in the same or in an analogous manner as the release layer 210 may be formed, as previously mentioned with reference to FIG. 1B. Alternatively, the first glue layer 251, the first release layer 211, the second glue layer 252, the second release layer 212, and the third glue layer 253 may all be sequentially formed on the upper surface 100a of the wafer 100.

Referring to FIGS. 3B and 3C, the wafer 100 and the carrier 300 may be bonded together with each other. Optionally, the glue layers 251, 252, and 253, and the release layers 211 and 212 may be strengthened by applying heat to improve heat-resistance and/or adhesion properties. The first to third glue layers 251, 252, and 253 may be stacked to comprise the glue layer 250. The first release layer 211 may be embedded between the first and second glue layers 251 and 252, and the second release layer 212 may be embedded between the second and third glue layers 252 and 253. The glue layer 250 and the release layers 211 and 212 may comprise the bonding layer 200.

Referring to FIG. 3D, a chemical and/or mechanical polishing process, for example, may be performed on the lower surface 100b of the wafer 100 to remove wafer material until at least the second lower surface 100c is reached, a level at which the through electrodes 111 are not exposed. A dry etching process, for example, may then be performed on the second lower surface 100c to remove wafer material until at least the non-active surface 100d is reached, a level at which the through electrodes 111 are exposed. Thereafter, the lower insulation layer 107 may be formed to cover the non-active surface 100d of the wafer 100, and the pads 115 may be formed on the lower insulation layer 107 to be electrically connected to the through electrodes 111.

Referring to FIG. 3E, the carrier 300 may be separated from the wafer 100. For example, the carrier 300 may be detached by a clamping tool capable of grasping an end of the carrier 300. In this case, due to the surface topology or roughness of the upper surface 100a of the wafer 100, the second release layer 212, unlike the first release layer 211, may be sacrificially destroyed so that the carrier 300 may be relatively easily separated from the wafer 100. When the carrier 300 is separated, the third glue layer 253 and a portion 212a of the second release layer 212 may also be separated from the wafer 100. Optionally, protection tape 500 may be attached to the non-active surface 100d of the wafer 100 and the holder 510 may be used to hold the wafer 100 stable when the carrier 300 is separated from the wafer 100.

Alternatively, as illustrated in FIG. 3F, a crack 422 may be formed in the second glue layer 252 to separate the carrier 300. The crack 422 may be created by a physical method. For example, an initiator 400, such as a blade, may be used to impact the second glue layer 252 to create the crack 422. When the carrier 300 is being detached from the wafer 100, the crack 422 may propagate, preferably through the second release layer 212 in the shape of a straight line, rather than through the first release layer 211 in the shape of a curved line. Due to the propagation of the crack 422, the carrier 300 may be detached from the wafer 100 more easily.

Figure 3G:
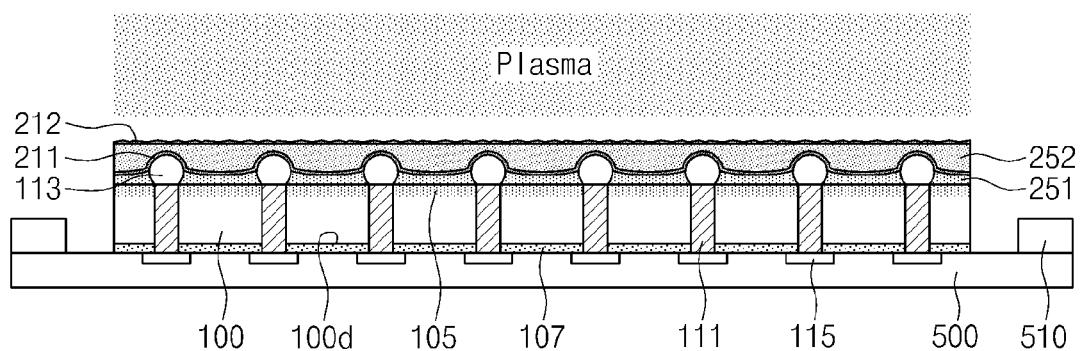

Referring to FIG. 3G, the second release layer 212 may remain on the second glue layer 252 when the carrier 300 is separated from the wafer 100. Having the second release layer 212 remain on the second glue layer 252 may weaken a bonding force between a rolling tape (600 of FIG. 3H) and the second glue layer 252 so that the second glue layer 252 may not be easily removed. According to an embodiment, a plasma treatment may be performed to remove the second release layer 252. The plasma treatment may use a plasma gas including, for example, at least one of oxygen, nitrogen, and argon.

Figure 3H:
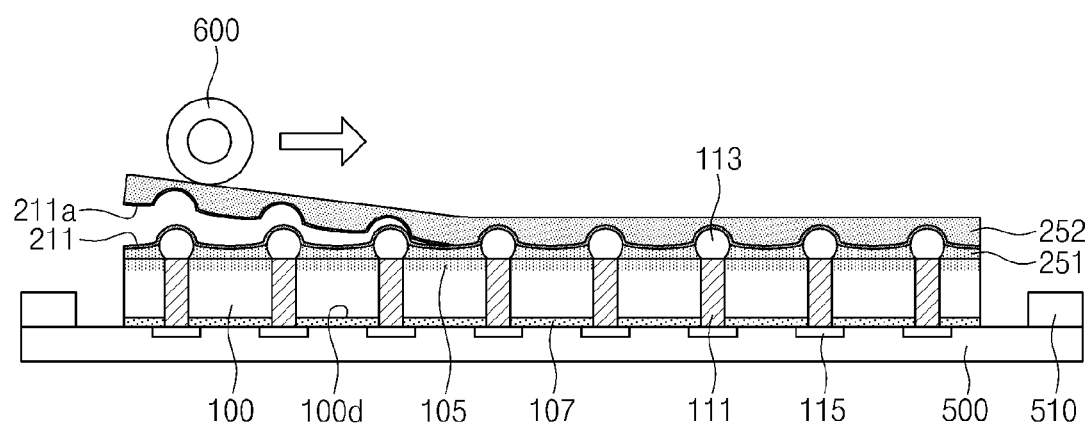

Referring to FIG. 3H, the second glue layer 252 may be removed. In an embodiment, the second glue layer 252 may adhere to rolling tape 600 that is moved along the wafer 100 to remove the second glue layer 252. The first release layer 211 may facilitate the separation of the second glue layer 252. Since the second release layer 212 on the second glue layer 252 is already removed by the plasma treatment, as previously mentioned with reference to FIG. 3G, the adhesive strength between the rolling tape 600 and the second glue layer 252 may be strong enough for the second glue layer 252 to be relatively easily separated from the wafer 100. The first release layer 211 may be separated along with with the second glue layer 252 or may remain on the wafer 100. Alternatively, a portion of the first release layer 211 may be separated along with with the second glue layer 252 while another portion of the first release layer 211 may remain on the wafer 100.

Figure 3I:
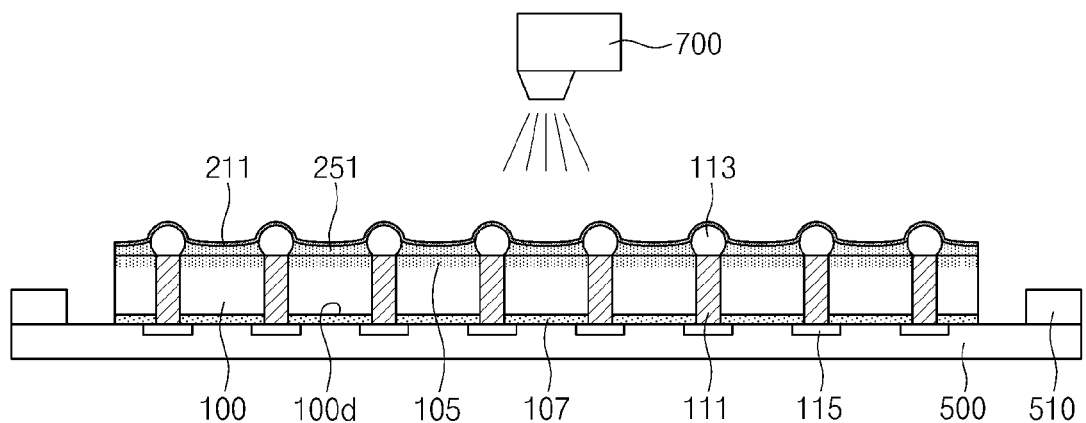

Referring to FIG. 3I, the wafer 100 may be cleaned. For example, a cleaning solution may be sprayed on the wafer 100 through sprayer 700 to remove the first release layer 211 and the first glue layer 251. The cleaning solution may comprise, for example, at least one of diazabicycloundecene (DBU) and tetra-n-butylammonium fluoride (TBAF) that is mixed with a solvent, such as acetate. Alternatively, after separation of the carrier 300 from the second release layer 212, the cleaning solution may be sprayed on the wafer 100 to remove the first and second release layers 211 and 212 and the first and second glue layers 252 and 252.

Figure 4A:
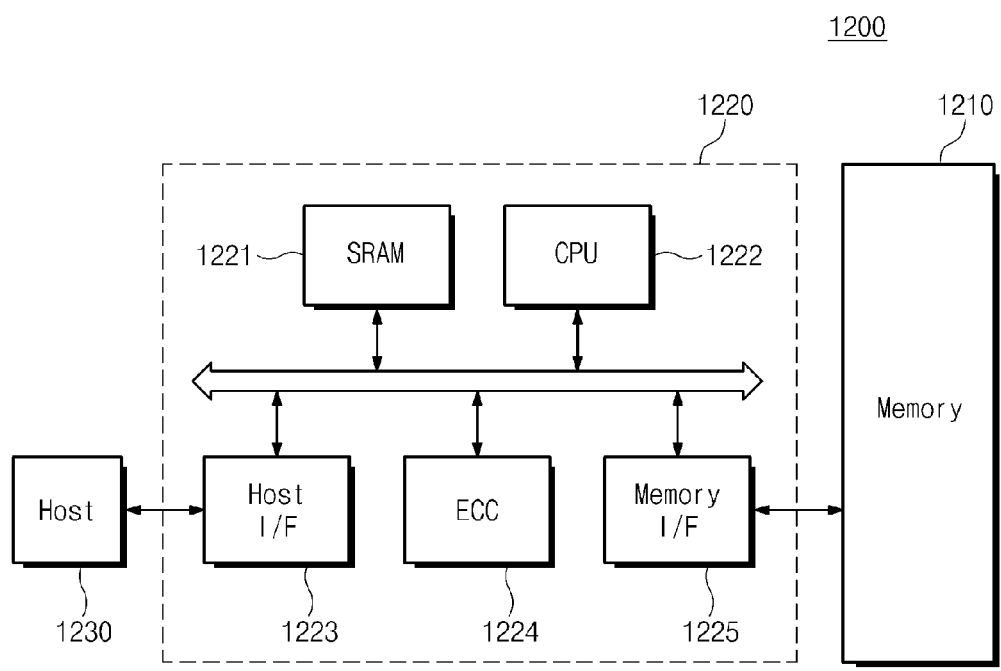
FIG. 4A is a schematic block diagram illustrating an example of memory cards including at least one semiconductor apparatus, according to an embodiment of the present inventive concept.
Figure 4B:
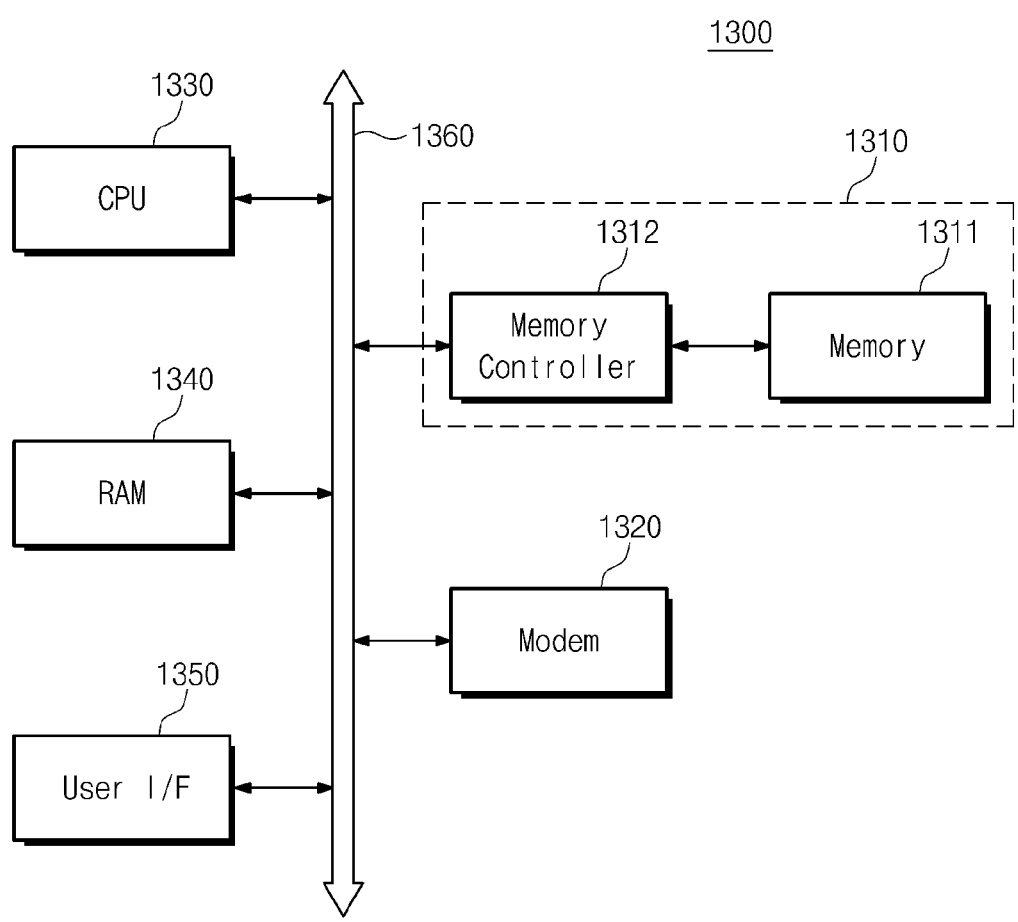
FIG. 4B is a schematic block diagram illustrating an example of an information process system including at least one semiconductor apparatus, according to an embodiment of the present inventive concept.

FIG. 4A is a schematic block diagram illustrating an example of memory cards including at least one semiconductor apparatus, according to an embodiment of the present inventive concept. FIG. 4B is a schematic block diagram illustrating an example of an information process system including at least one semiconductor apparatus, according to an embodiment of the present inventive concept.

Referring to FIG. 4A, a semiconductor memory 1210 including at least one of the semiconductor chips 10 and the semiconductor package 1, according to an embodiment of the inventive concept is applicable to a memory card 1200. For example, the memory card 1200 may include a memory controller 1220, which generally controls data exchange between a host 1230 and a flash memory device 1210. An SRAM 1221 is used as a working memory for a processing unit 1222. A host interface 1223 has the data exchange protocol of the host 1230 connected to the memory card 1200. An error correction coding block 1224 detects and corrects errors of data that are read from the multi-bit flash memory device 1210. A memory interface 1225 interfaces the semiconductor memory device 1210, according to an example embodiment. The processing unit 1222 generally controls data exchange of the memory controller 1220.

Referring to FIG. 4B, an information processing system 1300 may include a memory system 1310 having at least one of the semiconductor chips 10 and the semiconductor package 1, according an embodiment of the inventive concept. The information processing system 1300 may include, for example, a mobile device or a computer. For example, the information processing system 1300 may include a modem 1320, a central processing unit 1330, RAM 1340, and a user interface 1350 electrically connected to the memory system 1310 via a system bus 1360. The memory system 1310 may include a memory 1311 and a memory controller 1312 and have substantially the same configuration, for example, as that of the memory card 1200 in FIG. 4A. The memory system 1310 stores data processed by the central processing unit 1330 or data input from the outside. The information process system 1300 may be provided, for example, as a memory card, a semiconductor device disk, a camera image sensor, and other application chipsets.

According to an embodiment of the present inventive concept, the glue (250, 251, 252, and/or 253) and release (210, 211, and/or 212) layers are formed, for example, from thermosetting material so that the wafer 100 and the carrier 300 may be bonded together with thermal stability. Therefore, the wafer 100 may be processed or worked in a high temperature process with assurance that the wafer 100 is firmly bonded to the carrier 300. Moreover, the carrier 300 may be easily detached from the wafer 300 when the thermosetting glue (250, 251, 252, and/or 253) and release (210, 211, and/or 212) layers are used. Also, the present inventive concept may be applicable to the mass production of semiconductor apparatuses that include through electrodes 111 and that are stable and of good quality.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method for processing a substrate, the method comprising:
    providing a bonding layer between the substrate and a carrier to bond the substrate to the carrier, the substrate and the carrier respectively including surfaces facing to each other;
    processing the substrate while the substrate is supported by the carrier; and
    removing the bonding layer to separate the substrate from the carrier,
    wherein the bonding layer includes a thermosetting release layer provided on the surface of the substrate and a thermosetting glue layer provided on the surface of the carrier, and
    wherein the substrate further includes a plurality of bumps on the surface thereof such that the thermosetting release layer has a curved shape extending along a profile of the bumps.

2. The method of claim 1, wherein a bonding force between the thermosetting release layer and the thermosetting glue layer is less than a bonding force between the thermosetting glue layer and the carrier.

3. The method of claim 1, wherein the bumps roundly project over the surface of the substrate and the thermosetting release layer contacts at least projected portions of the bumps.

4. The method of claim 1, wherein the substrate further includes a plurality of through-electrodes partially penetrating therethrough,
    wherein the processing the substrate comprises:
    recessing an opposite surface of the substrate to expose the through-electrodes through the recessed opposite surface of the substrate; and
    forming a plurality of pads on the recessed opposite surface of the substrate, the pads electrically connected to the through-electrodes.

5. The method of claim 1, wherein the removing the bonding layer comprises:
    separating the carrier and the thermosetting glue layer from the substrate; and
    providing a cleaning solution onto the substrate to remove the thermosetting release layer therefrom.

6. The method of claim 5, wherein the cleaning solution comprises acetate mixed with at least one of diazabicycloundecene (DBU) and tetra-n-butylammonium fluoride (TBAF).

7. The method of claim 1, after the proving the bonding layer, further comprising providing heat to the bonding layer.

8. The method of claim 7, wherein the providing heat to the bonding layer comprises baking the bonding layer to strengthen the thermosetting glue layer and the thermosetting release layer.

9. The method of claim 1, wherein the providing the bonding layer comprises:
    providing a first thermosetting material on the surface of the substrate to form the thermosetting release layer;
    providing a second thermosetting material on at least one of the thermosetting release layer and the surface of the carrier,
    wherein the first thermosetting material is different from the second thermosetting material.

10. The method of claim 9, wherein
    the first thermosetting material comprises at least one of polydimethylsiloxane (PDMS) and hexamethyldisiloxane (HMDSO), and
    the second thermosetting material comprises siloxane.

11. The method of claim 1, wherein the providing the bonding layer comprises:
    providing a first thermosetting material on the surface of the substrate to form the thermosetting release layer;
    patterning the thermosetting release layer to remove an edge thereof located at an edge of the substrate; and
    providing a second thermosetting material, which is different from the first thermosetting material, on at least one of the thermosetting release layer and the surface of the carrier to form the thermosetting glue layer.

12. A method for processing a substrate, the method comprising:
    providing a substrate including a plurality of bumps on a first surface thereof;
    sequentially forming a thermosetting release layer and a first thermosetting sub-glue layer on the first surface of the substrate, the thermosetting release layer having a curved shape extending along a profile of the bumps;
    providing a second thermosetting sub-glue layer to the thermosetting release layer between the substrate and a carrier to bond the substrate to the carrier;
    thinning the substrate while the substrate is supported by the carrier to produce a thinned substrate;
    separating the carrier and the second thermosetting sub-glue layer from the thermosetting release layer; and
    cleaning the thinned substrate to remove the thermosetting release layer and the first thermosetting sub-glue layer from the thinned substrate.

13. The method of claim 12, wherein the thinning the substrate comprises recessing an opposite second surface of the substrate to produce the thinned substrate having the recessed second surface,
    wherein the substrate further comprises a plurality of through-electrodes extending from the first surface toward the second surface, at least one of the through-electrodes being exposed through the recessed second surface of the thinned substrate.

14. The method of claim 12, wherein the first and second thermosetting sub-glue layers contact to each other to form a thermosetting glue layer between the thermosetting release layer and the carrier while the substrate is boned to the carrier,
    wherein the thermosetting glue layer and the thermosetting release layer are combined together to create a bonding layer interposed between the substrate and the carrier.

15. The method of claim 14, further comprising:
    performing a first bake process on the bonding layer at a low temperature insufficient to strengthen the thermosetting glue and release layers; and
    performing second bake process on the bonding layer at a high temperature sufficient to strengthen the first baked thermosetting glue and release layers.

16. The method of claim 12, wherein the substrate comprises a semiconductor wafer, and the carrier comprises one of a glass substrate and a material identical to that of the substrate.

17. A method for processing a substrate, the method comprising:
    forming a thermosetting release layer on the substrate, wherein the substrate includes a plurality of bumps formed on a first surface on which the thermosetting release layer is formed such that the first surface of the substrate has rough topology;
    forming a thermosetting glue layer on a carrier, wherein the carrier includes a surface, on which the thermosetting glue layer is formed, whose topology is smoother than that of the first surface of the substrate;

bonding the substrate to the carrier;
processing the substrate while the substrate is supported by the carrier; and
removing the carrier from the substrate.

18. The method of claim 17, wherein the forming the thermosetting glue layer on the carrier comprises:
forming a first portion of the thermosetting glue layer on the carrier; and
forming a second portion of the thermosetting glue layer on the thermosetting release layer.

19. The method of claim 18, further comprising forming a second thermosetting release layer on the first portion of the thermosetting glue layer formed on the carrier.

20. The method of claim 17, further comprising cleaning the substrate to remove the thermosetting release layer from the first surface of the substrate.

* * * * *